United States Patent [19]

Andren et al.

[11] Patent Number: 5,675,339
[45] Date of Patent: Oct. 7, 1997

[54] A/D REFERENCE LEVEL ADJUSTMENT CIRCUIT TO MAINTAIN OPTIMUM DYNAMIC RANGE AT THE A/D

[75] Inventors: Carl Frank Andren, Indialantic; Ravindra V. Gokhale, Satellite Beach; Leonard V. Lucas; Jim Snell, both of Palm Bay, all of Fla.

[73] Assignee: Harris Corporation, Melbourne, Fla.

[21] Appl. No.: 509,589

[22] Filed: Jul. 31, 1995

[51] Int. Cl.[6] .................................. H03M 1/12
[52] U.S. Cl. .................................. 341/155
[58] Field of Search .................. 341/155, 118, 341/120, 132, 139

[56] References Cited

U.S. PATENT DOCUMENTS 4,482,916  11/1984  Acampora .................. 358/27

*Primary Examiner*—Brian K. Young
*Attorney, Agent, or Firm*—Rogers & Killeen

[57] ABSTRACT

A method and circuit for controlling a reference voltage for an analog-to-digital converter having plural outputs includes a sensor for indicating when outputs from the A/D converter are at least a desired voltage, and a processor responsive to the sensor and connected to a digital-to-analog converter which provides a reference voltage for the A/D converter. The processor provides signals to the D/A converter which change the reference voltage. A logic unit in the processor increments an accumulator when either an I or a Q component in the A/D converter output is at least the desired voltage and decrements the accumulator when neither the I nor the Q component is at least the desired voltage. A counter may buffer the accumulator changes by using only several of the most significant bits of the counter to change the A/D converter reference voltage.

20 Claims, 2 Drawing Sheets

A/D REFERENCE LEVEL ADJUSTMENT CIRCUIT TO MAINTAIN OPTIMUM DYNAMIC RANGE AT THE A/D

BACKGROUND OF THE INVENTION

This application is related to application Ser. No. 08/509,586 entitled "A Method of Estimating signal Quality for a Direct Sequence Spread Spectrum Receiver"; application Ser. No. 08/509,588 entitled "Fast Acquisition Bit Timing Loop Method and Apparatus"; application Ser. No. 08/509,590 entitled "Short Burst Direct Acquisition Direct Sequence Spread Spectrum Receiver"; application Ser. No. 08/509,587 entitled "Short Burst Acquisition Circuit for Direct Sequence Spread Spectrum Links", all of which are incorporated by reference, and are filed concurrently herewith and assigned to the assignee hereof.

The present invention relates to analog-to-digital converters, and more particularly to a circuit and method for controlling a reference voltage provided to an analog-to-digital converter.

Analog-to-digital (A/D) converters are used in a variety of applications in which the dynamic range of the A/D converter may need to be adjusted in real time in order to maintain the desired dynamic range in the face of changing conditions. For example, a direct sequence radio communications receiver includes an A/D converter in which the number of bits used to sample I and Q baseband signals in the output from the converter is to be as small as possible, desirably only three bits for each of the I and Q samples. Each additional bit needed to sample the signals approximately doubles the required number of comparators in the receiver.

However, variations in operating conditions (e.g., temperature) and in manufacturing tolerance can change the signal level by several dB, as much as 8 dB in some radios. An 8 dB variation can use up about 1.5 bits of the three bits if there is no compensation for the variation. This degradation causes a loss of about one half of the converter's dynamic range and is unacceptable in many applications.

The typical solution in the prior art is to increase the number of bits used to sample the signals and accept the resulting additional size and complexity. The nominal signal level may be set so that at the minimum signal level into the A/D converter the required number of bits is met, and at the maximum signal level saturation of the A/D converter is held to an acceptable level. The additional components needed for operation at the maximum signal level represent excess capacity that would not have to been provided if a reference voltage level for the A/D converter were adjusted.

Accordingly, it is an object of the present invention to provide a novel circuit and method for controlling the reference voltage for an A/D converter to thereby avoid the problems of the prior art.

It is another object of the present invention to provide a novel circuit and method for controlling the reference voltage for an A/D converter in which the peak voltages in the outputs from the A/D converter are measured and the reference voltage adjusted in response to the measurement.

It is yet another object of the present invention to provide a novel circuit and method for controlling a reference voltage for an A/D converter in which signals are provided to the A/D converter to increase the reference voltage when any of the outputs from the A/D converter are at least a peak output voltage and to decrease the reference voltage when none of the outputs are at least the peak output voltage.

It is still another object of the present invention to provide a novel circuit and method for controlling a reference voltage for an A/D converter in which a logic unit responsive to sensed I and Q voltages in the output from the A/D converter increments an accumulator by a first amount when either the I or Q output is the peak voltage and decrements the accumulator by a second amount when neither I nor Q outputs have reached the peak voltage.

It is a further object of the present invention to provide a novel circuit and method for controlling a reference voltage for an A/D converter in which sensed I and Q voltages in the output from the A/D converter increment or decrement an accumulator and in which a counter responsive to the accumulator changes its count when the accumulator over or under flows, wherein the signals to change the reference voltage are provided when there is a change in a predetermined number of most significant bits of the count in the counter.

It is yet a further object of the present invention to provide a novel circuit and method for controlling a reference voltage for an A/D converter in which a D/A converter for providing reference voltages to the A/D converter includes two resistor sets, each with N substantially similar segments for providing N+1 voltages levels, and two sets of N+1 switches, each for selectively tapping one of the N segments in one of the two resistor sets, whereby one set of switches provides a "positive" reference to the A/D converter and the other set of switches provides a "negative" reference to the A/D converter.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
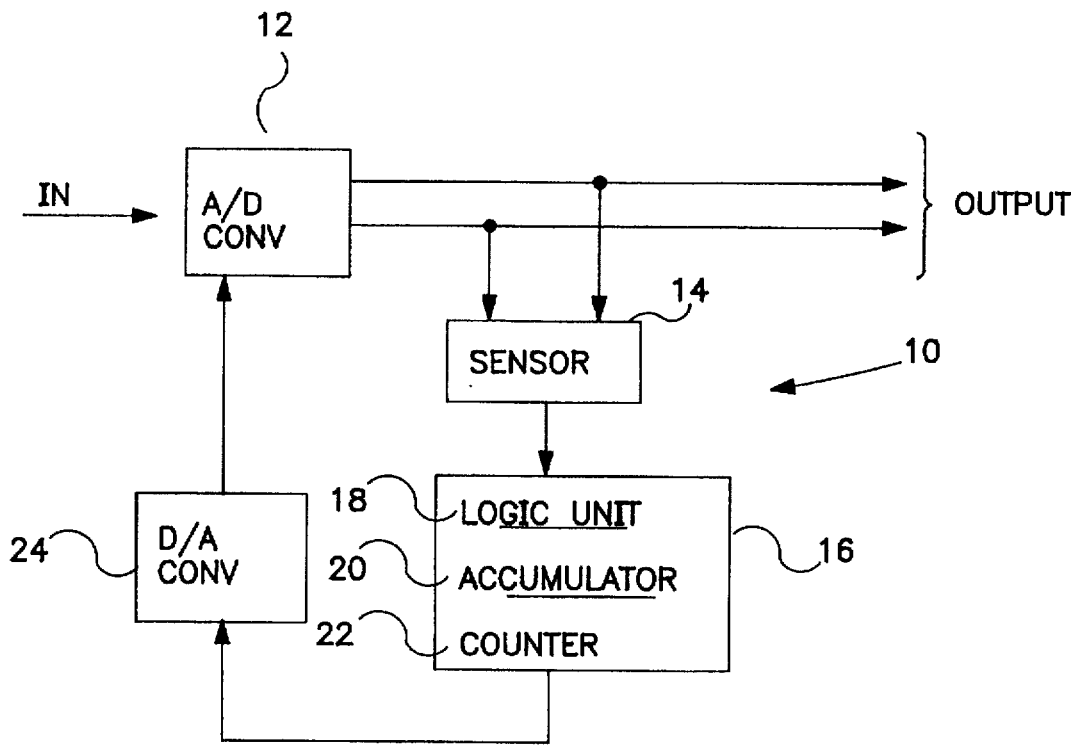
FIG. 1 is a block diagram of an embodiment of the present invention.

With reference now to FIG. 1, an embodiment of the present invention may include a circuit 10 for adjusting the reference voltage for an A/D converter 12 that has plural outputs. A sensor 14 monitors the outputs from A/D converter 12 and determines whether the outputs have a desired voltage. Outputs from A/D converter 12 will be signals that desirably have either a plus or minus voltage equal to a predetermined full scale voltage. The output voltages will change as conditions effecting A/D converter 12 and preceding circuitry change (for example, temperature) and thus the sensed voltages will be less than, equal to, or greater than the desired voltage, depending on whether the reference voltage for A/D converter 12 is too high, correct, or too low, respectively.

By way of further explanation, the reference voltage may be thought of as setting the position of a reference line relative to the output signal level. Desirably the reference line coincides with the peak of the output signal level. If the output signal level is above the reference line (that is, the reference voltage is too low), the reference line may be moved up by increasing the reference voltage so that the reference line once again coincides with the peak of the output signal.

Sensor 14 senses whether the output voltages are the desired voltage and sends signals to a processor 16 which indicate that the voltages are either at least the desired voltage or less than the desired voltage. Processor 16 may include a logic unit 18 for incrementing an accumulator 20 by a first amount if any of the outputs are at least the desired voltage, and for decrementing accumulator 20 by a second amount if none of the outputs are at least the desired voltage. As will be discussed below, an increase in accumulator 20 will translate to an increase in A/D converter reference voltage (that is, the sensed voltage is at peak or higher and thus the reference voltage may be increased), and a decrease in accumulator 20 will translate to an decrease in reference voltage (that is, the sensed voltage is below peak and thus the reference voltage may be decreased).

Accumulator 20 may have a predetermined capacity, and when accumulator 20 over or under flows (we are dealing with plus and minus values) a count in a counter 22 may be changed in an appropriate direction. In turn, counter 22 may provide a signal to digital-to-analog (D/A) converter 24 for adjusting a reference voltage provided by D/A converter 24 to A/D converter 12. The signal from counter 22 is desirably provided after a predetermined count has been reached to buffer frequent small changes in the signal to D/A converter 24. The sensitivity of circuit 10 may be set by selection of the first and second values, and by selection of the buffer provided by counter 22.

Figure 2:
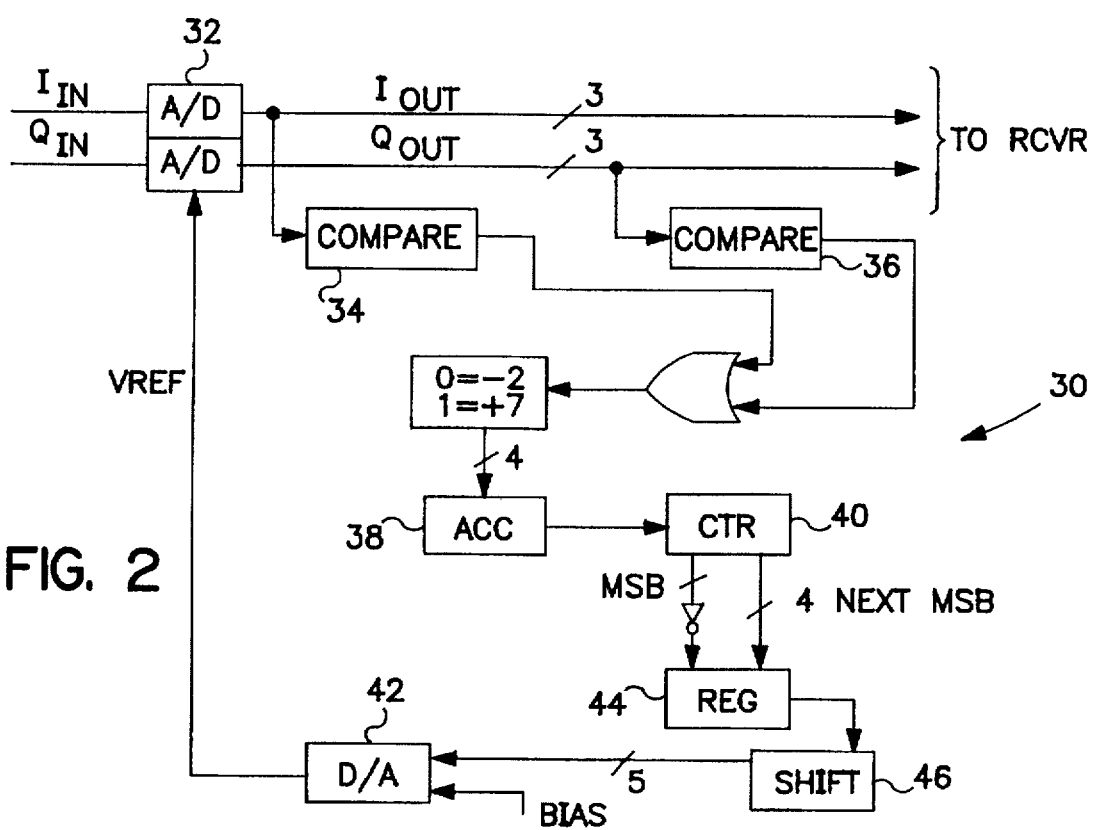
FIG. 2 is a partial block and partial circuit diagram of a further embodiment of the present invention.

With reference now to FIG. 2, a further embodiment of the present invention may include a circuit 30 for adjusting the reference voltage for an A/D converter 32 that has I and Q outputs. In the embodiment illustrated in FIG. 2 and discussed further below, A/D converter 32 provides 3 bit I and Q outputs and the components in circuit 30 are sized accordingly, although the invention is not so limited. I and Q outputs may be monitored by sensors 34 and 36 respectively, each of which provide a digital signal to an OR unit. If either the I or the Q output is the desired (full scale) voltage, the OR unit sends a signal which increments an accumulator 38 by a first amount, +7 in this embodiment. If neither the I nor the Q output is the desired voltage, the OR unit sends a signal which decrements an accumulator 38 by a second amount, −2 in this embodiment. In direct sequence radios the noisy sign waves provided to A/D converter 32 typically have a voltage distribution that peaks at plus and minus the full scale voltage, and the selection of +7 and −2 keeps the average voltage near half scale, although other values may be used.

Accumulator 38 capacity may be just large enough to provide a small buffer for fluctuations in the signal from the OR unit, and may have a 4 bit capacity in this embodiment (including one sign bit).

A more substantial buffer may be provided by a counter 40 that may be incremented by one each time accumulator 38 overflows (goes too far positive), and may be decremented by one each time accumulator underflows (goes too far negative). The buffering may be provided by electing to use only several of the most significant bits (MSB) from counter 40 in the further processing by which the reference voltage for A/D converter 32 is adjusted. For example, counter 40 may have a 20 bit capacity (including a sign bit) and only the five MSB (one being a sign bit) may be used.

The selection of counter size and number of MSB used in this embodiment provides a slow reference voltage adjustment and the selection may be varied as needed. Temperature and component variations typically occur slowly, thereby permitting use of a long term average, as in this embodiment. By way of further explanation, the MSB from counter 40 produce the reference voltage for A/D converter 32. A nominal amount of headroom in A/D converter 32 is set by the ratio of the two amounts (+7 and −2 in this embodiment). The time constant for averaging is also set by the magnitude of the two amounts in conjunction with the particular MSB selected.

The MSB from counter 40 may be provided to a D/A converter 42, via a register 44 and barrel shifter 46. D/A converter 42 may provide the reference voltage adjustments to A/D converter 32. An initial condition may be provided to decrease settling time.

Figure 3:
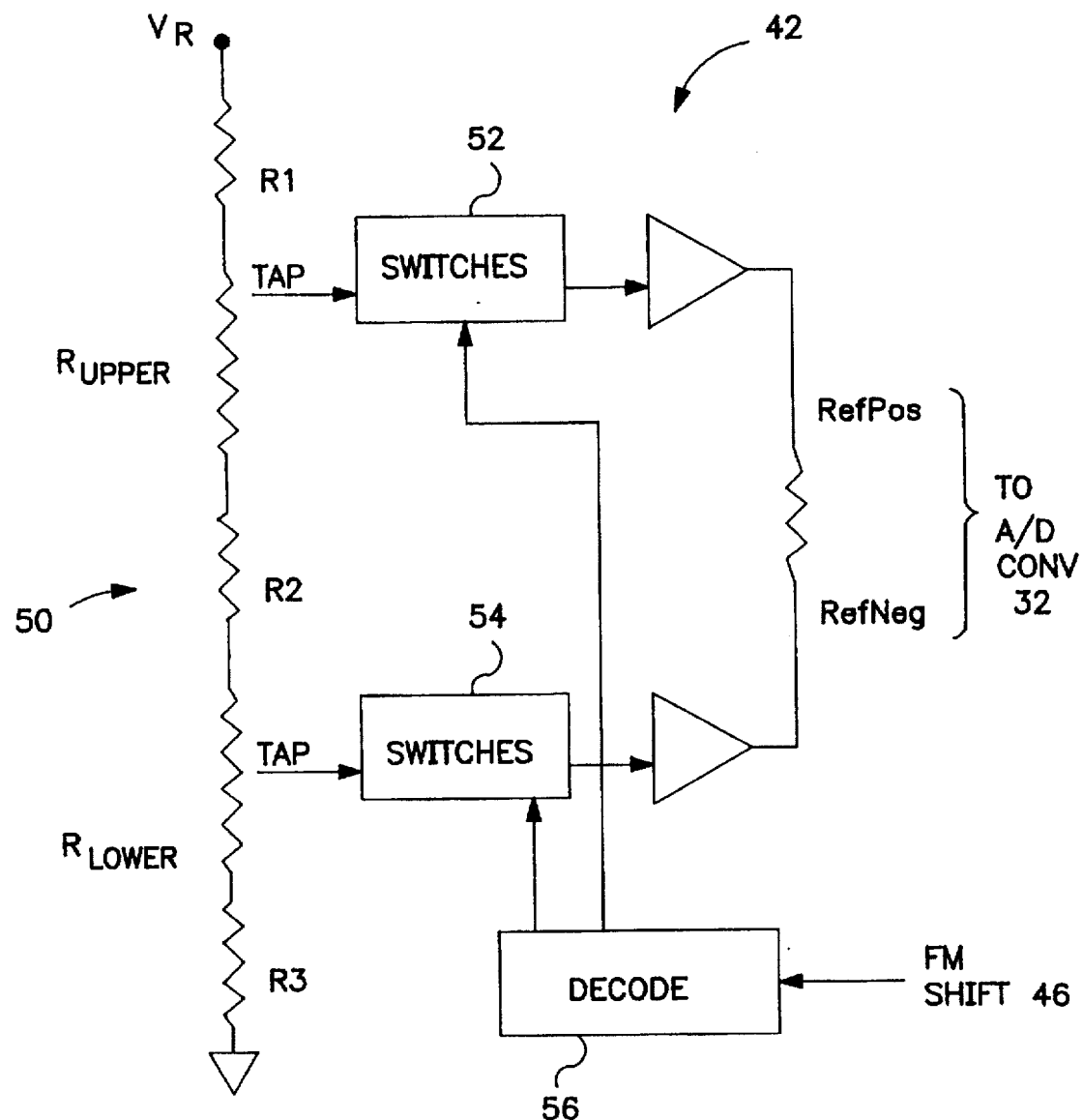
FIG. 3 is a circuit diagram of an embodiment of the digital-to-analog converter of the present invention.

With reference now to FIG. 3, D/A converter 42 may receive a five bit digital word from barrel shifter 46 and provide reference voltages as needed to A/D converter 32. In this embodiment, reference voltages for A/D converter 32 range from 0.25 to 1.0 volts and are provided by D/A converter 42 in 31 equal steps and the components in D/A converter 42 are so scaled, although the invention is not so limited.

D/A converter 42 may include a series of resistors 50 controlled by switches 52 and 54 which each include plural switches for tapping appropriate voltages from the resistors in series 50. A 2.0 volt reference $V_R$ may be used to develop the resistor tap voltages. The upper tapped resistor $R_{upper}$ may include 31 substantially identical resistor segments to develop 32 voltage output levels equally spaced from 0.875 to 1.25 volts. Each tap of $R_{upper}$ is independently selectable by 32 switches in switch 52 that operate in response to the digital input signal (e.g., code 00000 for 0.875 volts). Similarly, the lower tapped resistor $R_{lower}$ may include 31 substantially identical resistor segments to develop 32 voltage output levels equally spaced from 0.625 to 0.25 volts. Each tap of $R_{lower}$ is independently selectable by 32 switches in switch 54.

Resistor tap selection may be controlled by decoder 56 which controls selection of the plural switches in switch 52 and switch 54. Decoder 56 may insure that only one tap voltage for each upper and lower tap is applied to each switch output.

Switch output voltage may be buffered and applied to A/D converter 32 "positive" reference (RefPos) and "negative" reference (RefNeg). The difference in reference voltages may range from 0.25 for the lowest tap selection (code 00000) to 1.0 volts for the highest tap selection (code 11111), such as shown below in Table 1. Note that "positive" and "negative" are relative terms indicating whether the references are above or below a bias, such the bias of 0.75 volts in Table 1.

TABLE 1

| Digital Input | Upper Tap | Lower Tap | RefPos-RefNeg |
|---|---|---|---|
| 00000 | 0.8750 V | 0.6250 V | 0.2500 V |
| 00001 | 0.8871 V | 0.6129 V | 0.2742 V |
| 00011 | 0.8992 V | 0.6008 V | 0.2984 V |
| ... | ... | ... | ... |
| 11101 | 1.2258 V | 0.2742 V | 0.9516 V |
| 11110 | 1.2379 V | 0.2621 V | 0.9758 V |
| 11111 | 1.2500 V | 0.2500 V | 1.0000 V |

With reference again to a preferred embodiment of the invention, the selection of the metric for determining the voltage in the output from the A/D converter was based primarily on hardware considerations. Detection on only one output of the converter could be used, but if the signal were BPSK modulated and a zero frequency offset condition prevailed, all of the signal energy could be in only one of the two quadrature channels, possibly the one not being monitored. This would result in a lack of detection. The sum of $I^2+Q^2$ could also be used, but this increases the hardware needs. The selection herein of the metric in which separate detections of the voltages in the outputs are averaged minimizes the hardware requirements.

Those of skill in the art will recognize that the circuit and method of the present invention may cause the reference voltage to change by an amount that could affect further uses of the output of the A/D converter. One of the intended uses is as a quantizer of a noisy signal. For this application, the long term or DC accuracy of the A/D converter is not critical for its functioning as a quantizer. The A/D converter reference voltage effectively sets the gain of the quantizer. This keeps a constant number of effective bits independent of the average signal voltage at the input to the A/D converter.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A circuit for controlling a reference voltage for an analog-to-digital (A/D) converter having plural outputs, the circuit comprising:

a sensor connected to an A/D converter for indicating when outputs from the A/D converter are at least a desired voltage; and counting means responsive to said sensor and connected to a digital-to-analog (D/A) converter which provides a reference voltage for the A/D converter, said counting means for providing signals to said D/A converter which increase the reference voltage when any of the outputs from the A/D converter are at least the desired voltage and which decrease the reference voltage when none of the outputs are at least the desired voltage, said counting means comprising a scaler for adjusting the sensitivity of said counting means to said sensor.

2. The circuit of claim 1 wherein said counting means further comprises a logic unit responsive to said sensor and connected to an accumulator, said logic unit for incrementing said accumulator by a first amount when any of the outputs from the A/D converter are at least the desired voltage and for decrementing said accumulator by a second amount when none of the outputs are at least the desired voltage.

3. The circuit of claim 2 wherein said scaler comprises a counter responsive to said accumulator for changing a count of said counter when said accumulator over or under flows, and for providing the signals to said D/A converter to change the reference voltage when there is a change in a predetermined number of most significant bits of the count in said counter, whereby said predetermined number and said first and second amounts set the sensitivity of said counting means to said sensor.

4. The circuit of claim 1 wherein the outputs from the A/D converter are I and Q components, and wherein said counting means further comprises a logic unit responsive to said sensor and connected to an accumulator, said logic unit for incrementing said accumulator by a first amount when either the I or the Q output from the A/D converter is at least the desired voltage and for decrementing said accumulator by a second amount when neither the I nor the Q output is at least the desired voltage.

5. The circuit of claim 4 wherein said scaler comprises a counter responsive to said accumulator for changing a count of said counter when said accumulator over or under flows, and for providing the signals to said D/A converter to change the reference voltage.

6. The circuit of claim 5 wherein said accumulator has a four bit capacity, and said first amount is seven and said second amount is two.

7. The circuit of claim 6 wherein said counter has a twenty bit capacity, and wherein said predetermined number of most significant bits is five.

8. The circuit of claim 1 wherein said D/A converter comprises a series of resistors and plural switches for selectively tapping said series of resistors responsive to the signals from said counting means to change the reference voltage.

9. The circuit of claim 8 wherein said series of resistors comprises two resistor sets, each with N substantially similar segments for providing N+1 voltages levels, and wherein said plural switches comprise two sets of N+1 switches, each said set of N+1 switches for selectively tapping one of said N segments in one of said two resistor sets, whereby one said set of switches provides one of said N+1 voltage levels from one of said two resistor sets as a "positive" reference to the A/D converter and the other said set of switches provides one of said N+1 voltage levels from the other of said two resistor sets as a "negative" reference to the A/D converter, wherein "positive" and "negative" are relative to a bias voltage.

10. The circuit of claim 9 wherein the difference between the reference voltages varies from 0.25 to 1.0 volts, and wherein N is thirty-one.

11. A circuit for providing a reference voltage to an analog-to-digital (A/D) converter which provides I and Q digital outputs, the circuit comprising:

a sensor connected to an A/D converter for indicating when I and Q outputs from the A/D converter are either a plus or a minus full scale voltage;

a logic unit responsive to said sensor and connected to an accumulator, said logic unit for incrementing said accumulator by a first amount when either the I or the Q output from the A/D converter is either a plus or a minus full scale voltage and for decrementing said accumulator by a second amount when neither the I nor the Q output is either a plus or a minus full scale voltage;

a digital-to-analog (D/A) converter which provides a reference voltage for the A/D converter; and a counter responsive to said accumulator for changing a count of said counter when said accumulator over or under flows, and for providing the signals to said D/A converter to change the reference voltage when there is a change in a predetermined number of most significant bits of the count in said counter, whereby signals to said D/A converter from said counter increase the reference voltage when either the I or the Q output from the A/D converter is either a plus or a minus full scale voltage and which decrease the reference voltage when neither the I nor the Q output is either a plus or a minus full scale voltage.

12. The circuit of claim 11 wherein said D/A converter comprises two resistor sets, each with N substantially similar segments for providing N+1 voltages levels, and two sets of N+1 switches, each said set of N+1 switches for selectively tapping one of said N segments in one of said two resistor sets, whereby one said set of switches provides one of said N+1 voltage levels from one of said two resistor sets as a "positive" reference voltage to the A/D converter and the other said set of switches provides one of said N+1 voltage levels from the other of said two resistor sets as a "negative" reference voltage to the A/D converter.

13. A method of controlling a reference voltage for an analog-to-digital (A/D) converter which provides I and Q digital outputs, the method comprising the steps of:

(a) sensing when I and Q outputs from an A/D converter are at least a desired voltage;

(b) forming signals for increasing the reference voltage when either the I or the Q output from the A/D converter is at least the desired voltage and decreasing the reference voltage when neither the I nor the Q output is at least the desired voltage; and (c) providing the formed signals to a D/A converter which provides a reference voltage for the A/D converter.

14. The method of claim 13 wherein the step of forming the signals comprises the steps of incrementing an accumulator by a first amount when either the I or the Q output from the A/D converter is at least the desired voltage and decrementing the accumulator by a second amount when neither the I nor the Q output is at least the desired voltage.

15. The method of claim 14 further comprising the step of changing a count in a counter when the accumulator over or under flows, and providing the signals to the D/A converter to change the reference voltage when there is a change in a predetermined number of most significant bits of the count.

16. The method of claim 13 further comprising the step of providing the reference voltages from the D/A converter by selectively tapping a series of resistors responsive to the formed signals.

17. The method of claim 16 wherein the step of providing the reference voltage comprises the steps of tapping two resistor sets in the series of resistors using two sets of switches, each of the two resistor sets having N substantially similar segments for providing N+1 voltages levels and each of the two sets of switches having N+1 switches for selectively tapping one of the N segments in one of the two resistor sets, one set of switches providing one of the N+1 voltage levels from one of the two resistor sets as a "positive" reference to the A/D converter and the other set of switches providing one of the N+1 voltage levels from the other of the two resistor sets as a "negative" reference to the A/D converter.

18. A circuit for controlling a reference voltage for an analog-to-digital (A/D) converter having plural outputs, the circuit comprising:

a counting means responsive to said first sensor and said second sensor, connected to a digital-to-analog (D/A) converter, and providing a reference voltage for the A/D converter, said counting means comprising a logic unit receiving the output of said first sensor and said second sensor, an accumulator receiving the output of the logic unit, and a counter receiving the output of the accumulator, wherein the counter generates a signal and provides the signal to the D/A converter to change the reference voltage.

19. A method of controlling a reference voltage for an analog-to-digital (A/D) converter which provides I and Q digital outputs, the method comprising the steps of:

(a) sensing the I output from an A/D converter using a first sensing means to determine the voltage while simultaneously sensing the Q output from the A/D converter using a second sensing means to determine the voltage;

(b) comparing the I and the Q outputs against a desired voltage using a logic means;

(c) accumulating the output from the logic means;

(d) forming a signal for increasing the reference voltage when either the I or the Q output from the A/D converter is at least the desired voltage and decreasing the reference voltage when neither the I nor the Q output is at least the desired voltage; and (e) providing the formed signal to a D/A converter which provides a reference voltage to the A/D converter.

20. The circuit of claim 1 wherein said sensor comprises a first sensor connected to a first output from an A/D converter for indicating when the first output from the A/D converter is at least a desired voltage;

a second sensor connected to a second output from the A/D converter for indicating when the second output from the A/D converter is at least a desired voltage.

* * * * *